United States Patent [19]
Gaumet et al.

[11] Patent Number: 5,847,931
[45] Date of Patent: Dec. 8, 1998

[54] CONTACTLESS INTEGRATED CIRCUIT CARD WITH A CONDUCTIVE POLYMER ANTENNA

[75] Inventors: Michel Gaumet, Saint-Denis-En-Val; Benoît Thevenot, Olivet, both of France

[73] Assignee: Solaic, France

[21] Appl. No.: 842,707

[22] Filed: Apr. 16, 1997

[30] Foreign Application Priority Data

Apr. 23, 1996 [FR] France ................................... 96 05097

[51] Int. Cl.[6] ...................................................... H05K 01/18
[52] U.S. Cl. .......................... 361/737; 361/760; 361/761; 361/777; 361/752; 25/380; 25/439; 25/492; 25/451; 257/723; 257/724; 257/679; 257/684; 257/687; 257/787
[58] Field of Search ..................................... 361/737, 760, 361/761, 777, 752, 753, 755, 757, 793–795; 235/380, 439, 492, 451; 257/723, 724, 679, 684, 687, 787

[56] References Cited

U.S. PATENT DOCUMENTS

| | | | |
|---|---|---|---|
| 4,943,464 | 7/1990 | Thomson | 174/524 |
| 5,321,240 | 6/1994 | Takahira | 235/380 |
| 5,448,110 | 9/1995 | Tuttle et al. | 257/723 |
| 5,498,859 | 3/1996 | Farmont | 235/384 |
| 5,610,941 | 3/1997 | Tanaka et al. | 375/222 |
| 5,671,525 | 9/1997 | Fidalgo | 29/600 |

FOREIGN PATENT DOCUMENTS

| | | |
|---|---|---|
| 9417001 | 12/1994 | Germany . |
| 4431605 | 3/1996 | Germany . |

*Primary Examiner*—Gregory Thompson
*Assistant Examiner*—David Foster
*Attorney, Agent, or Firm*—Griffin, Butler, Whisenhunt & Szipl, LLP

[57] ABSTRACT

An integrated circuit card comprising a card body, an integrated circuit fixed in a cavity of the card body, an antenna extending over a face of the card body and connected to the integrated circuit, and a layer of resin covering the integrated circuit and at least a portion of the card body immediately adjacent to the integrated circuit.

2 Claims, 1 Drawing Sheet

CONTACTLESS INTEGRATED CIRCUIT CARD WITH A CONDUCTIVE POLYMER ANTENNA

The present invention relates to an integrated circuit card.

BACKGROUND OF THE INVENTION

So-called "contactless" integrated circuit cards are known comprising a card body of plastics material, an integrated circuit fixed in a cavity of the card body, and an antenna extending over a face of the card body and connected to the integrated circuit. It is known that the antenna can be made by depositing a conductive polymer, in particular by silkscreen printing.

In all known contactless cards, provision is made for covering the integrated circuit and the antenna by means of a covering sheet which serves to hold the integrated circuit in the cavity of the card body and to protect the antenna and its connection to pads of the integrated circuit.

The covering sheet is generally put into place by hot rolling. In order to reduce manufacturing cost, it is the general practice to make a plurality of cards simultaneously by placing a plurality of integrated circuits on a common sheet of plastics material and then making the antennas associated with the respective integrated circuits simultaneously. A covering sheet is then laid over the slab obtained in this way, and the assembly is placed in a rolling press where the slab and the associated covering sheet are heated and subjected to pressure. The resulting assembly is the cut up to separate the various cards.

In spite of the savings obtained by making a plurality of cards simultaneously, putting a covering sheet into place remains very expensive because of the major investment represented by a rolling press and because of the relatively long period of time (about 20minutes) required for the operation of rolling the covering sheet onto the card body. Also, the operation of rolling the covering sheet constitutes a bottleneck relative to the other steps of card manufacture and constitutes an obstacle to achieving high manufacturing throughput rates.

In addition, ever increasing competition means that research is constantly required into reducing costs while requirements concerning operational reliability of cards continue to increase.

Card manufacturers are thus perpetually faced with seeking to satisfy two contradictory objectives, namely reducing manufacturing cost and maintaining sufficient quality in the products obtained.

OBJECTS AND SUMMARY OF THE INVENTION

The invention provides an integrated circuit card comprising a card body, an integrated circuit fixed in a cavity of the card body, an antenna of conductive polymer extending over a face of the card body and connected to the integrated circuit, and a layer of resin covering the integrated circuit and at least a portion of the card body immediately adjacent to the integrated circuit.

Thus, since the protective resin can be deposited continuously, e.g. by silkscreen printing, this operation is performed at low cost while protecting at least the zone of the card which is most likely to be the cause of the card not functioning. A satisfactory compromise is thus achieved between seeking reduced cost and maintaining good reliability.

It will be observed that when the antenna is of small dimensions, or when an antenna is superposed over the integrated circuit, making a layer of resin over the integrated circuit and over the immediately adjacent portion of the card body serves to cover all of the elements that form the sensitive portion of the integrated circuit card, thus obtaining a reduction in price without any loss of reliability compared with existing systems.

In an advantageous version of the invention, the integrated circuit has a thickness of less than 120 $\mu$m and is disposed substantially in the vicinity of the neutral fiber of the card under the layer of resin. Thus, the very small thickness of the integrated circuit imparts very great flexibility thereto, minimizing stresses when the card is flexed, and locating it in the vicinity of the neutral fiber of the card further reduces stresses, in particular in the vicinity of the edge of the integrated circuit where there exists a greater risk of the antenna breaking, such that this advantageous version of the invention serves to further increase reliability without increasing the cost of the integrated circuit card.

BRIEF DESCRIPTION OF THE DRAWING

Other characteristics and advantages of the invention appear on reading the following description of a particular, non-limiting embodiment of the invention described with reference to the sole accompanying figure which is a section view through the contactless card of the invention.

MORE DETAILED DESCRIPTION

Figure 1:
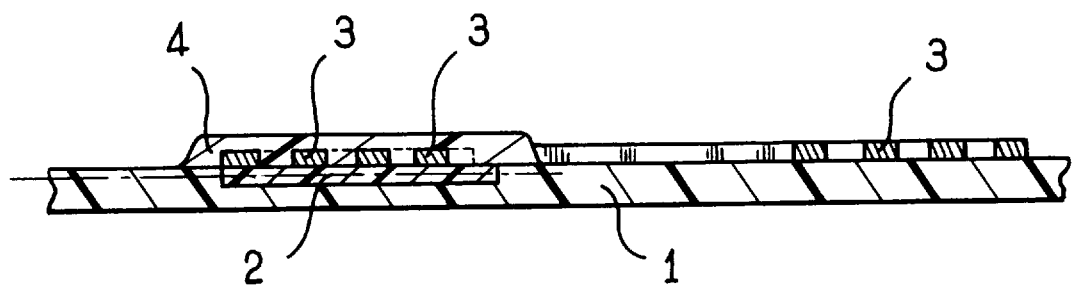

With reference to the figure, the contactless card of the invention comprises in conventional manner a card body 1 of plastics material, an integrated circuit 2 fixed in a cavity of the card body, e.g. by hot pressing the integrated circuit into the card body, and an antenna 3 extending over a face of the card body and connected to the integrated circuit. In conventional manner, the integrated circuit is flush with one of the faces of the card body, and the antenna 3 is implemented, for example, in the form of a series of turns of conductive polymer silkscreen printed on the face of the card body 1 that is flush with the integrated circuit 2.

According to the invention, the contactless card also includes a layer of resin 4 covering the integrated circuit 2 and at least a proton of the card body immediately adjacent to the integrated circuit.

According to an advantageous aspect of the invention, the integrated circuit 2 is of small thickness, preferably it being less than about 120 $\mu$m thick, and it is located substantially in the vicinity of the neutral fiber of the card under the layer of resin 4, as represented by a fine chain-dotted line in FIG. 1. This reduces the stresses to which the integrated circuit, and above all the connections between the integrated circuit and the antenna, are subjected while the contactless card of the invention is being put into place on an object.

Naturally, the invention is not limited to the embodiment described and variant embodiments can be applied thereto without going beyond the ambit of the invention as defined by the claims.

In particular, although the invention is shown in association with a card in which the layer of resin 4 does not cover the antenna 3 completely, it is possible to provide a layer of resin 4 that completely covers the assembly constituted by the integrated circuit and the antenna, or even that completely covers the corresponding face of the card body.

Although the invention is illustrated with reference to a contactless card including an inductive antenna, the antenna could equally well be a capacitive coupling element or any coupling element that enables signals to be transmitted without making contact.

We claim:

1. An integrated circuit card comprising a card body, an integrated circuit having a face flush with a face of the card body, and an antenna of conductive polymer extending overland on said face of the card body and connected to the integrated circuit, the card including a layer of resin covering the integrated circuit and all or a portion of said face of the card body immediately adjacent to the integrated circuit.

2. An integrated circuit card according to claim 1, wherein the integrated circuit has a thickness of less than 120 $\mu$m and is disposed in the vicinity of the neutral fiber of the card under the layer of resin.

* * * * *